(12) United States Patent
Chau et al.

(10) Patent No.: US 7,795,723 B2
(45) Date of Patent: Sep. 14, 2010

(54) CAPPED SENSOR

(75) Inventors: Kevin H.-L. Chau, Andover, MA (US);
Lawrence E. Felton, Hopkinton, MA (US); John A. Geen, Tewksbury, MA (US); Michael W. Judy, Wakefield, MA (US); John R. Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 1424 days.

(21) Appl. No.: 11/039,368

(22) Filed: Jan. 20, 2005

(65) Prior Publication Data
US 2005/0205959 A1 Sep. 22, 2005

Related U.S. Application Data

(60) Provisional application No. 60/542,339, filed on Feb. 5, 2004, provisional application No. 60/554,235, filed on Mar. 18, 2004.

(51) Int. Cl.
*H01L 23/12* (2006.01)

(52) U.S. Cl. .................... 257/704; 257/729; 257/782; 257/E23.193

(58) Field of Classification Search ................ 257/467
See application file for complete search history.

(56) References Cited

U.S. PATENT DOCUMENTS

| | | | | |
|---|---|---|---|---|
| 825,717 A * | 7/1906 | Collin | ...................... | 132/76.5 |
| 2,440,189 A | 4/1948 | Zworykin | | |
| 3,564,303 A * | 2/1971 | Geil et al. | ................... | 310/319 |
| 4,915,772 A * | 4/1990 | Fehlner et al. | ................ | 117/44 |
| 5,055,270 A * | 10/1991 | Consadori et al. | ............ | 422/98 |
| 5,719,333 A | 2/1998 | Hosoi et al. | .............. | 73/514.05 |
| 6,025,767 A * | 2/2000 | Kellam et al. | ............... | 335/128 |
| 6,171,880 B1 | 1/2001 | Gaitan et al. | .................. | 438/52 |
| 6,182,509 B1 | 2/2001 | Leung | ..................... | 73/514.05 |
| 6,236,046 B1 * | 5/2001 | Watabe et al. | ............ | 250/338.1 |
| 6,303,986 B1 | 10/2001 | Shook | ........................ | 257/680 |

(Continued)

FOREIGN PATENT DOCUMENTS

DE 4243978 C1 1/1994

(Continued)

OTHER PUBLICATIONS

Authorized Officer Gregory Adam, *The International Search Report and the Written Opinion of the International Searching Authority*, International Searching Authority, Jun. 23, 2005, 17 pages.

(Continued)

*Primary Examiner*—Alonzo Chambliss
(74) *Attorney, Agent, or Firm*—Sunstein Kann Murphy & Timbers LLP

(57) ABSTRACT

A sensor element is capped by bonding or otherwise forming a cap on a sensor element. The sensor may be hermetically sealed by using a hermetic cap and hermetic bonding material or by applying a hermetic coating. The sensor may be filled with a gas at an elevated pressure. The sensor may alternatively or additionally be filled with a special gas, such as a gas having a density-to-viscosity ratio above approximately 0.2.

13 Claims, 4 Drawing Sheets

U.S. PATENT DOCUMENTS

| | | | |
|---|---|---|---|
| 6,323,550 B1 | 11/2001 | Martin et al. | 257/704 |
| 6,330,464 B1 * | 12/2001 | Colvin et al. | 600/316 |
| 6,465,280 B1 | 10/2002 | Martin et al. | 438/125 |
| 6,551,853 B2 * | 4/2003 | Toyoda | 438/90 |
| 6,589,433 B2 | 7/2003 | Leung | 216/2 |
| 6,621,158 B2 | 9/2003 | Martin et al. | 257/704 |
| 6,666,088 B2 | 12/2003 | Leung | 73/488 |
| 6,672,154 B1 * | 1/2004 | Yamagishi et al. | 73/204.22 |
| 6,722,199 B2 | 4/2004 | Ploechinger | 73/514.09 |
| 6,937,479 B2 * | 8/2005 | Anderson et al. | 361/769 |
| 2003/0075794 A1 | 4/2003 | Felton et al. | 257/707 |
| 2005/0126760 A1 * | 6/2005 | Makino et al. | 165/104.26 |
| 2005/0229710 A1 * | 10/2005 | O'Dowd et al. | 73/718 |
| 2006/0027915 A1 * | 2/2006 | Tarn | 257/706 |
| 2006/0105503 A1 * | 5/2006 | Ding et al. | 438/125 |

FOREIGN PATENT DOCUMENTS

| | | | |
|---|---|---|---|
| DE | 19810286 A1 | | 9/1999 |
| DE | 10219248 A1 | | 11/2003 |
| EP | 0825717 | * | 2/1998 |
| EP | 0664456 B1 | | 7/1999 |
| WO | WO 01/19142 A1 | | 3/2001 |

OTHER PUBLICATIONS

Leung, et al., *Micromachined Accelerometer Based on Convection Heat Transfer*, IEEE, 1998, 4 pages.

Luo, et al., *Thermal optimization on micromachined convective accelerometer*, Heat and Mass Transfer, vol. 38, Aug. 8, 2002, 705-712, 8 pages.

Mailly et al., *Design of a micromachined thermal accelerometer: thermal simulation and experimental results*, Microelectronics Journal, vol. 34, 2003, 275-282, 6 pages.

Milanovic et al., *Micromachined convective accelerometers in standard integrated circuits technology*, Applied Physics Letters, vol. 76 No. 4, Jan. 24, 2000, 508-510, 3 pages.

Authorized Officer Gregory Adam, *Invitation to Pay Additional Fees/Communication Relating to the Results of the Partial International Search*, International Searching Authority, May 2, 2005, 8 pages.

Luo et al. *An optimized micromachined convective accelerometer with no proof mass*, Journal of Micromechanics and Microengineers, 2001, pp. 504-508.

Authorized Officer Yolaine Cussac, *International Preliminary Report on Patentability*, 9 pages, Aug. 7, 2006.

George Chen and Joyce Ho, Redacted Copy of Reporting Letter from Taiwanese Associate, dated Oct. 5, 2009. TW Application No. 94102387.

* cited by examiner

CAPPED SENSOR

PRIORITY

This application claims priority from the following United States provisional patent applications, both of which are hereby incorporated herein by reference in their entireties:
Application No. 60/542,339 filed on Feb. 5, 2004; and
Application No. 60/554,235 filed on Mar. 18, 2004.

FIELD OF THE INVENTION

The invention generally relates to micromachined devices, and, more particularly, to capped sensors.

BACKGROUND OF THE INVENTION

Generally speaking, a convective accelerometer works by heating a gas in an enclosed chamber and sensing temperature changes at one or more areas of the chamber as the device forming the chamber is moved or rotated. Many convective accelerometers are packaged in hermetic packages. Those in the art understand, however, that hermetic packages are costly. Furthermore, those in the art understand that performance of convective accelerometers can be affected by heat loss.

SUMMARY OF THE INVENTION

In accordance with one aspect of the invention, a sensor element is hermetically capped at the wafer level. Caps may be applied individually, applied at wafer-level via wafer-to-wafer bonding, or formed in-situ as part of the wafer fabrication process. For example, a hermetic cap may be bonded to a sensor element using a hermetic-bonding material, such as, for example, a glass or metallic bonding material. Alternatively, a hermetic cap may be formed in-situ during a wafer fabrication process. By hermetically capping the sensor element at wafer level, such devices (e.g., accelerometers) can be smaller and/or packaged in less costly packages, such as a standard integrated circuit package.

In accordance with another aspect of the invention, a sensor element is capped by bonding a cap to the sensor element using a bonding material. The cap and/or the bonding material may be non-hermetic. The capped sensor may be made hermetic by adding a hermetic coating, such as silicon nitride, silicon dioxide, or aluminum, over the cap and/or the bonding material. A non-hermetic cap may have thermal insulating properties to help reduce loss of heat from within the sensor element.

In accordance with another aspect of the invention, a capped sensor element includes a cavity within which one or more sensor elements, such as a heating element and a temperature-sensing element, are situated. The cavity is formed by a portion of an underlying substrate and a portion of the cap. A thermal insulation layer is deposited or otherwise formed on the portion of the underlying substrate and/or the portion of the cap in order to reduce heat loss through the substrate and/or cap, respectively.

In accordance with another aspect of the invention, a capped sensor element is filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be introduced into the capped sensor element at an elevated pressure.

One or more of the above-mentioned aspects may be applied to micromachined convective accelerometers in order to reduce size, reduce cost, and/or improve performance. Such convective accelerometers generally include a substrate having at least one heating element and at least one temperature-sensing element disposed within a cavity formed by the substrate and the cap. A cap is disposed on the substrate.

In one exemplary embodiment, the cavity of the convective accelerometer is hermetically sealed using a hermetic cap. The cap may be bonded to the substrate using a hermetic bonding material, such as a glass or metallic bonding material, or the cap may be formed on the substrate in-situ during a wafer fabrication process. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure. The substrate and/or the cap may include a thermal insulating layer about the cavity so as to reduce loss of heat from the cavity. The thermal insulating layer may be formed by etching the substrate and/or the cap to form a porous layer.

In another exemplary embodiment, a convective accelerometer is capped by bonding a cap to the substrate, and the cavity of the convective accelerometer is hermetically sealed by applying a hermetic coating, such as silicon nitride, silicon dioxide, or aluminum, over the cap and/or the bonding material. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure. The substrate and/or the cap may include a thermal insulating layer about the cavity so as to reduce loss of heat from the cavity. The thermal insulating layer may be formed by etching the substrate and/or the cap to form a porous layer. The cap may be porous for providing thermal insulation for reducing loss of heat from the cavity.

In another exemplary embodiment, a capped convective accelerometer includes a thermal insulating layer on the cap and/or the substrate so as to reduce loss of heat from the cavity. The thermal insulating layer may be formed by etching the substrate and/or the cap to form a porous layer. The convective accelerometer may be hermetically sealed, for example, by bonding a hermetic cap to the substrate using a hermetic bonding material, such as a glass or metallic bonding material, or by applying a hermetic coating, such as silicon nitride, silicon dioxide, or aluminum, over the cap and/or bonding material. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure.

In another exemplary embodiment, a capped convective accelerometer is filled with gas having a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be introduced into the cavity at a pressure greater than atmospheric pressure.

The above-mentioned aspects may be applied to other types of micromachined sensors, including, but in no way limited to, accelerometers and gyroscopes, optical switches, and other micro-electromechanical systems (MEMS) and micro-opto-electromechanical systems (MOEMS).

Thus, the present invention may be embodied generally as apparatus including a substrate having at least one sensing element disposed within a cavity and a hermetic cap bonded to the substrate using a hermetic bonding material, such as a glass or metallic bonding material, so as to hermetically seal the cavity. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure. The substrate and/or the cap may include a thermal insulating layer about the cavity so as to reduce loss of heat from the cavity. The thermal insulating layer may be formed by etching the substrate and/or the cap to form a porous layer.

The present invention may also be embodied generally as apparatus including a substrate having at least one sensing element disposed within a cavity; a cap bonded to the substrate over the cavity using a bonding material, wherein at least one of the cap and the bonding material is porous; and a hermetic coating, such as silicon nitride, silicon dioxide, or aluminum, disposed over the cap and the bonding material so as to form a hermetical sealing of the cavity. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure. The substrate and/or the cap may include a thermal insulating layer about the cavity so as to reduce loss of heat from the cavity. The thermal insulating layer may be formed by etching the substrate and/or the cap to form a porous layer. The cap may be porous and may provide thermal insulation for reducing loss of heat from the cavity.

The present invention may also be embodied generally as apparatus including a substrate having at least one sensing element disposed within a cavity and a cap bonded to the substrate, wherein at least one of the substrate and the cap includes a thermal insulating layer about the cavity so as to reduce loss of heat from the cavity. The thermal insulating layer may be formed by etching the substrate and/or the cap to form a porous layer. The apparatus may be hermetically sealed, for example, by bonding a hermetic cap to the substrate using a hermetic bonding material, such as a glass or metallic bonding material, or by applying a hermetic coating, such as silicon nitride, silicon dioxide, or aluminum, over the cap and/or bonding material. The cavity may be filled with gas other than air. The gas may have a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be at a pressure greater than atmospheric pressure.

The present invention may also be embodied generally as apparatus including a substrate having at least one sensing element disposed within a cavity and a cap bonded to the substrate, wherein the cavity is filled with gas having a ratio of density (in grams per liter) to viscosity (in micropascal-seconds), when measured at a temperature of approximately 25 degrees Celsius and pressure of approximately one atmosphere, above approximately 0.2, and may include, for example, xenon, perfluoropropane, sulfur hexafluoride, or hexafluoroethane. The gas may be introduced into the cavity at a pressure greater than atmospheric pressure.

BRIEF DESCRIPTION OF THE DRAWINGS

The foregoing and advantages of the invention will be appreciated more fully from the following further description thereof with reference to the accompanying drawings wherein.

DETAILED DESCRIPTION OF A PREFERRED EMBODIMENT

Figure 1:
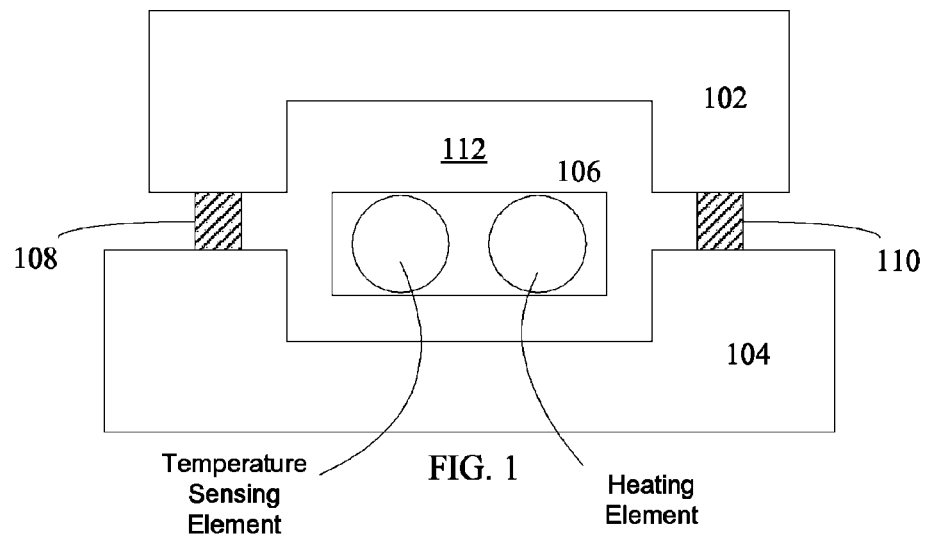
FIG. 1 is a schematic diagram showing a cross-sectional view of a hermetically capped sensor in accordance with an exemplary embodiment of the present invention.

In illustrative embodiments of the invention, a sensor element is hermetically capped at the wafer level. To that end, wafer-to-wafer bonding technology for the hermetic capping of MEMS devices can be used for capping sensors, such as convective accelerometers. Such caps might also be applied individually, or formed in-situ as part of the wafer fabrication process.

Since the sensitivity of a typical convective accelerometer increases with the square of the internal gas pressure, the latter can be increased up to, e.g., about 5 atmospheres, during cap bonding to enhance performance, or to reduce the sensor size without sacrificing performance. Further, a special gas, e.g., sulfur hexafluoride or xenon, can be chosen, e.g., to give a desirable trade off between noise and bandwidth.

In a convective accelerometer, the special gas is preferably one having a high density and a low viscosity. This is because the Grashof number, which governs the convection heat transfer process, is believed to have a significant influence on the sensitivity of a convective accelerometer, and three of the terms in the Grashof number are related to the particular gas. One of the terms (thermal expansion coefficient) generally varies little between different gasses. Therefore, for a defined gas pressure, the Grashof number will generally be higher for gasses having a high density/viscosity ratio. Gasses having a ratio of density (in grams per liter) to viscosity (in micropascal-seconds), when measured at a temperature of approximately 25 degrees Celsius and pressure of approximately one atmosphere, above approximately 0.2, such as xenon, perfluoropropane, sulfur hexafluoride, and hexafluoroethane, are good candidates for use in a convective accelerometer. It should be noted that moderate increases in gas pressure raise the density without significantly changing viscosity, and so increasing gas pressure generally increases the density/viscosity ratio. However, perfluoropropane is not a good candidate for use at high gas pressure if low temperature operation is required, (at one atmosphere perfluoropropane condenses at −36.7 degrees Celsius; the condensation temperature increases when pressure is increased).

Other considerations for selecting an appropriate gas might include reactivity (e.g., inert, non-corrosive, exhibits long term stability and is non-interactive with the materials inside the package cavity), safety (e.g., safe to handle, non-flammable, non-toxic, etc.), condensability (e.g., non-condensable in the temperature range of interest), availability (e.g., can be obtained as a high purity grade material from a reliable source at a price that is consistent with overall product cost), cost (e.g., can be cost-effectively handled in capping equipment), and regulatory considerations (e.g., meets regulatory standards, such as concerns with the use of partially chlorinated fluorocarbon gases (Freons)).

Illustrative embodiments of the invention thus cap the sensor element at the wafer level. This enables the capped accelerometer die to be packaged in low cost plastic packages that typically come with a larger variety of sizes. As a result, it is anticipated that the amount of on-chip electronics can be expanded without major cost penalty. Moreover, when compared to prior art methods, use of illustrative embodiments are expected to provide significantly more room for performance optimization and/or sensor size reduction because there is a much wider choice of gas types and much higher internal gas pressures are achievable at wafer level capping.

FIG. 1 shows a cross-sectional view of an exemplary hermetically capped sensor in accordance with an embodiment of the present invention. Among other things, the capped sensor includes a sensor element including substrate 104 and various heating/temperature-sensing elements 106 disposed within a depression formed in the substrate 104. A cap 102 is hermetically bonded to the substrate 104 using hermetic bonding materials 108 and 110, for example, such as certain glass or metallic bonding materials. The cap 102 typically includes a depression corresponding to the depression in the substrate 104 so that the capped sensor includes a cavity 112. In a convective accelerometer, the cavity 112 is filled with a gas that is heated by the heating element of 106 and circulates within the cavity 112. In preferred embodiments of the present invention, the gas is a special gas that is captured within the cavity 112 at an elevated pressure.

Performance of a convective accelerometer depends to some degree on the ability to maintain heat within the cavity 112. Heat loss through the cap 102 and/or the substrate 104 (which both act as heat sinks) can reduce performance of the accelerometer. Thus, in certain embodiments of the present invention, portions of the inside walls of the cap 102 and/or the substrate 104 are thermally insulated. Such thermal insulation can be accomplished by depositing or otherwise forming an insulating layer (or layers) on the inside walls. For example, for silicon caps, the insulating layer may be formed by chemically or electrochemically etching the cavity surface to make a porous silicon or porous silicon oxide layer. Electrochemical etching in an HF based electrolyte can be used to produce surface porosity in silicon wafers. The structure, size and depth of the pores can be controlled by suitable selection of etch parameters. Electrochemical etching is not always convenient because it generally requires electrical connection to localized areas. In such cases, stain etching also forms a porous surface in silicon. Stain etch solutions are typically mixtures of HF, nitric acid and water. Thermal insulation can be used alone or in combination with a hermetically sealed cap, a special gas, and/or an elevated internal gas pressure. It is not a requirement of the invention that both the cap and the substrate be thermally insulated.

Figure 2:
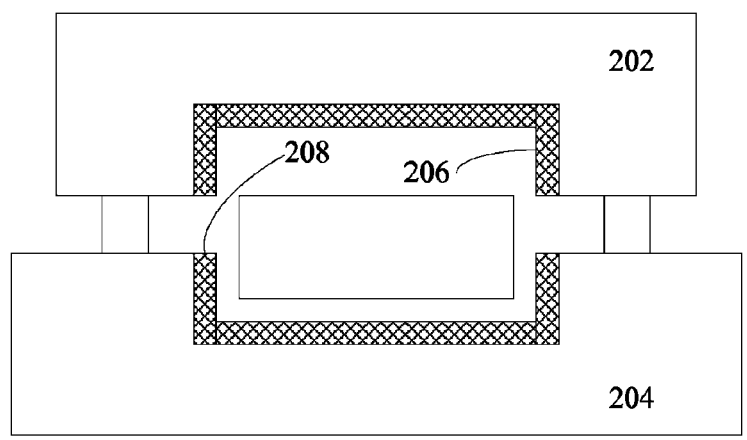
FIG. 2 is a schematic diagram showing a cross-sectional view of a capped sensor with thermally insulated cavity in accordance with an exemplary embodiment of the present invention.

FIG. 2 is a cross-sectional view of a capped sensor with thermally insulated cavity in accordance with an exemplary embodiment of the present invention. Among other things, the capped sensor includes a sensor element including substrate 204 including a depression having a thermal insulation layer 208. A cap 202 is bonded to the substrate 204, for example, using a hermetic bonding material. The cap 202 includes a depression having a thermal insulation layer 206 corresponding to the depression in the substrate 204. The thermal insulation layers 206 and 208 can be formed from different materials and/or in different ways.

In certain embodiments of the invention, the cap is made from a porous material (such as foam or plastic). The porous cap may have low thermal conductivity and so may help reduce heat loss through the cap in a convective accelerometer. Such porous materials are generally not hermetic, and therefore simply bonding them onto the substrate with a hermetic bonding material will generally not produce a hermetically sealed sensor. However, the porous materials can be so chosen that the leak rate for the special gas that is optionally introduced into the cavity at elevated pressure is sufficiently low. As a result, a substantial amount of the gas can be retained by the time a hermetic coating (such as silicon nitride, silicon dioxide, or aluminum) is added over the porous cap to produce a hermetically capped sensor. Such hermetic coating can be applied, e.g., by common physical or chemical vapor deposition methods.

Figure 3:
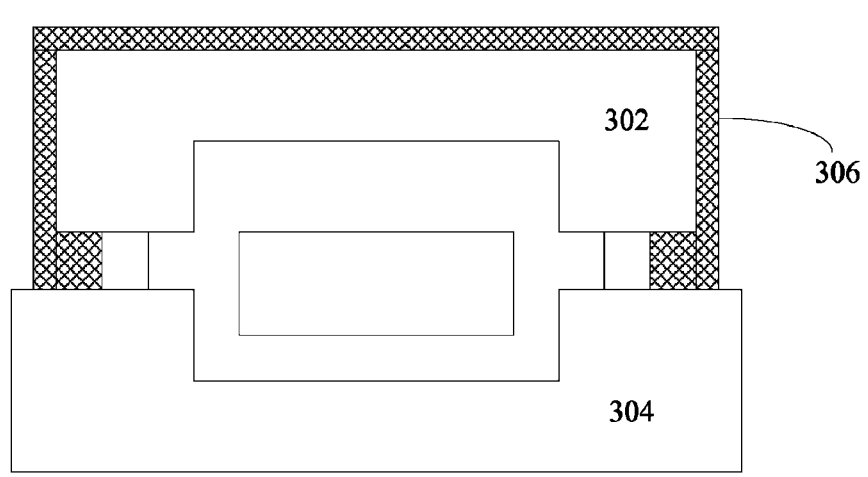
FIG. 3 is a schematic diagram showing a cross-sectional view of a capped sensor that is hermetically sealed using a hermetic coating in accordance with an exemplary embodiment of the present invention.

FIG. 3 is a cross-sectional view of a capped sensor that is hermetically sealed using a hermetic coating in accordance with an exemplary embodiment of the present invention. Among other things, the capped sensor includes a substrate 304 and a porous cap 302. The porous cap 302 may have thermal insulation properties. A hermetic coating 306 is added over the porous cap 302 to produce a hermetically capped sensor.

Figure 4:
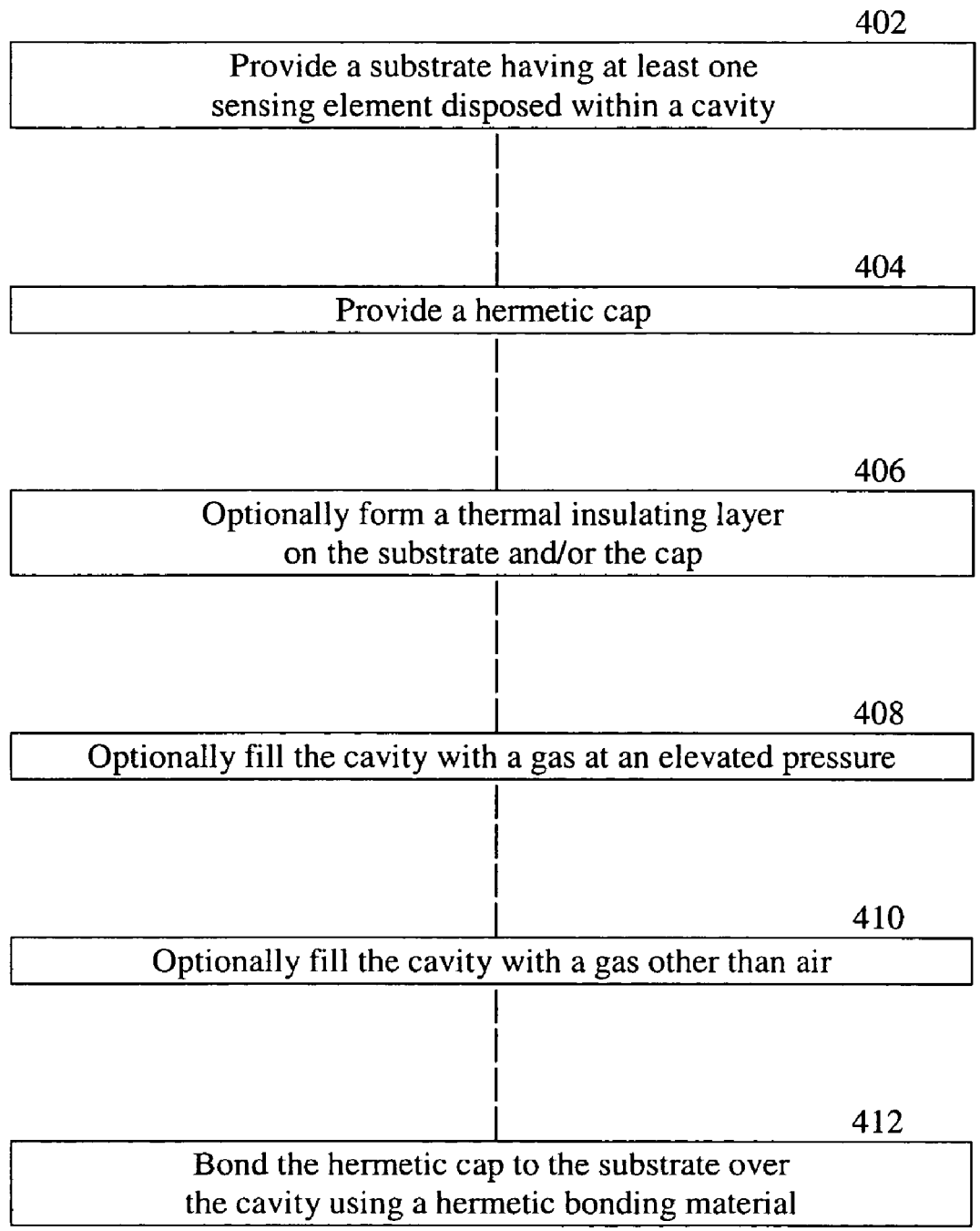
FIG. 4 is a flow diagram describing a first process for capping a sensor in accordance with an embodiment of the present invention.

FIG. 4 is a flow diagram describing a first process for capping a sensor in accordance with an embodiment of the present invention. A substrate having at least one sensing element disposed within a cavity is provided in block 402. A hermetic cap is provided in block 404. A thermal insulating layer is optionally formed on the substrate and/or the cap in block 406. The cavity is optionally filled with a gas at an elevated pressure in block 408. The cavity is optionally filled with a gas other than air in block 410. The hermetic cap is bonded to the substrate over the cavity using a hermetic bonding material in block 412.

Figure 5:
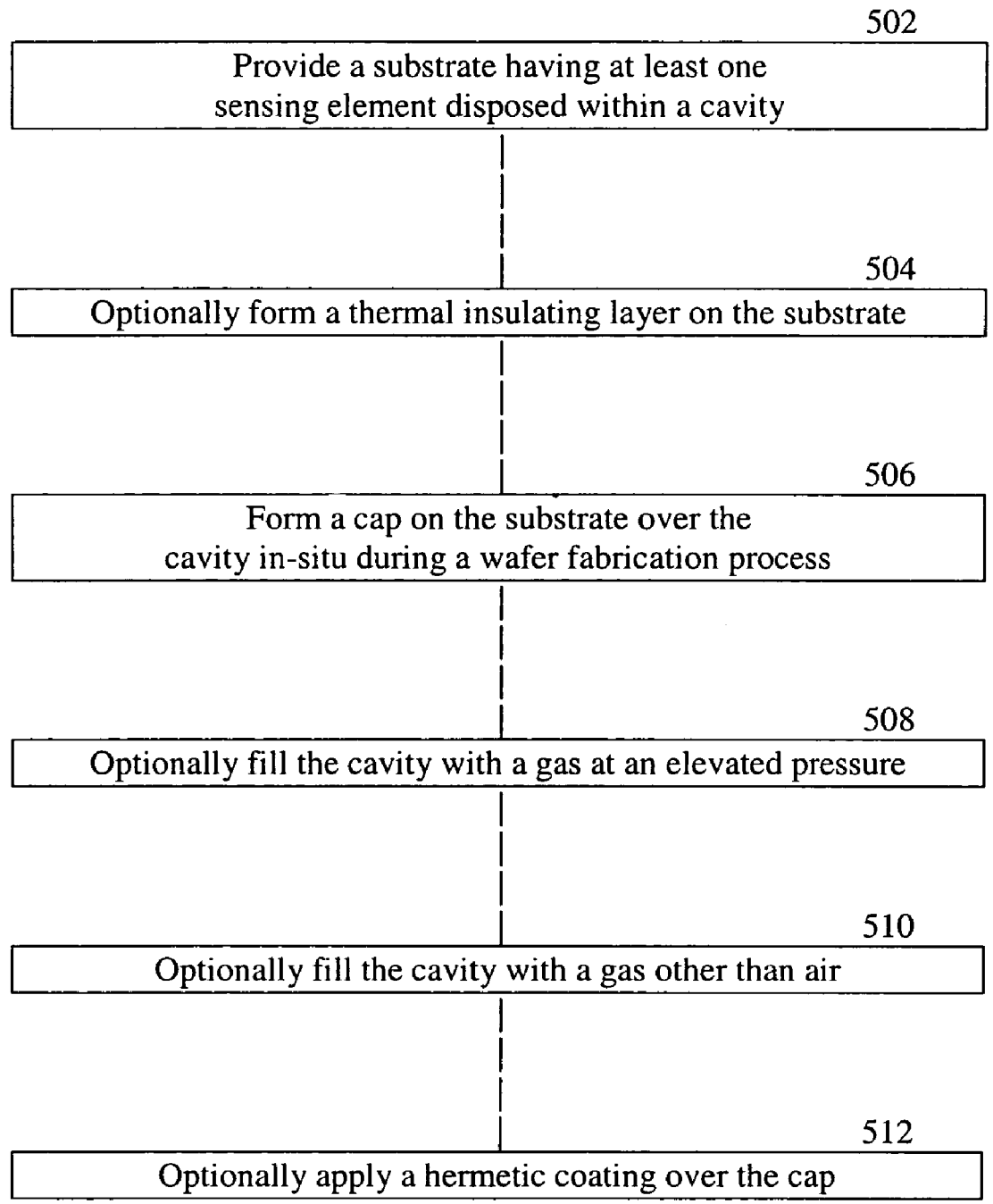
FIG. 5 is a flow diagram describing a second process for capping a sensor in accordance with an embodiment of the present invention.

FIG. 5 is a flow diagram describing a second process for capping a sensor in accordance with an embodiment of the present invention. A substrate having at least one sensing element disposed within a cavity is provided in block 502. A thermal insulating layer is optionally formed on the substrate in block 504. A cap is formed on the substrate over the cavity in-situ during a wafer fabrication process in block 506. The cavity is optionally filled with a gas at an elevated pressure in block 508. The cavity is optionally filled with a gas other than air in block 510. A hermetic coating is optionally applied over the cap in block 512.

Figure 6:
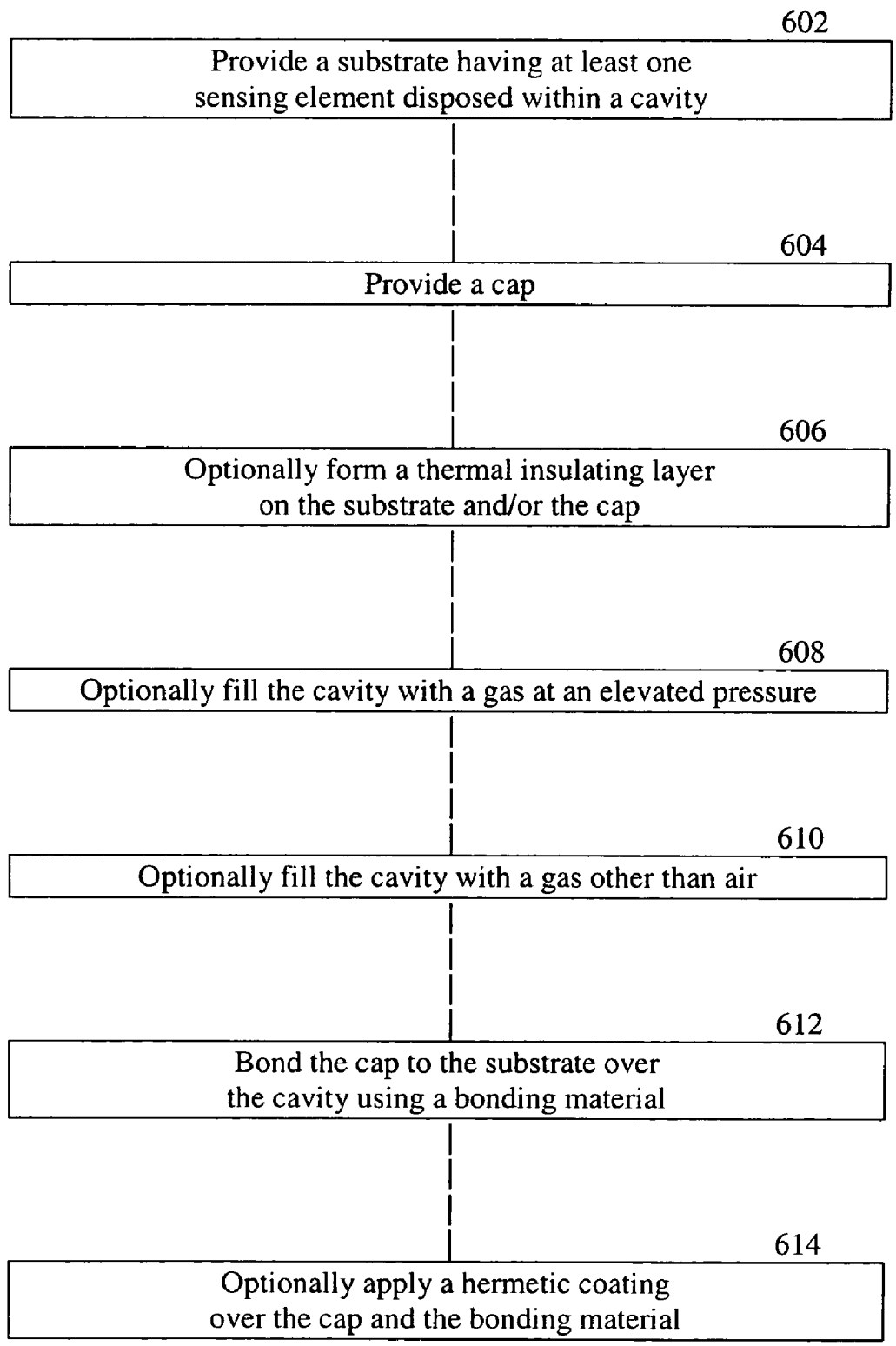
FIG. 6 is a flow diagram describing a third process for capping a sensor in accordance with an embodiment of the present invention.

FIG. 6 is a flow diagram describing a third process for capping a sensor in accordance with an embodiment of the present invention. A substrate having at least one sensing element disposed within a cavity is provided in block 602. A cap is provided in block 604. A thermal insulating layer is optionally formed on the substrate and/or the cap in block 606. The cavity is optionally filled with a gas at an elevated pressure in block 608. The cavity is optionally filled with a gas other than air in block 610. The cap is bonded to the substrate over the cavity using a bonding material in block 612. A hermetic coating is optionally applied over the cap and the bonding material in block 614.

While exemplary embodiments of the present invention are described above with reference to a convective accelerometer, the present invention is not limited to convective accelerometers. Rather, various aspects of the present invention can be applied to other types of micromachined sensors, including, but in no way limited to, accelerometers and gyroscopes, optical switches, and other micro-electromechanical systems (MEMS) and micro-opto-electromechanical systems (MOEMS).

Although the above discussion discloses various exemplary embodiments of the invention, it should be apparent that those skilled in the art can make various modifications that will achieve some of the advantages of the invention without departing from the true scope of the invention.

What is claimed is:

1. Apparatus comprising:
   a substrate having at least one sensing element;
   a cap bonded to the substrate over the at least one sensing element using a bonding material, wherein the substrate and the cap form a cavity around the at least one sensing element, and wherein at least one of the cap and the bonding material is porous; and
   a hermetic coating disposed over the cap and the bonding material so as to hermetically seal the cavity.

2. Apparatus according to claim 1, wherein the cavity is filled with gas other than air.

3. Apparatus according to claim 2, wherein the ratio of density (in grams per liter) to viscosity (in micropascal-seconds) of the gas at a temperature of approximately 25 degrees Celsius and pressure of approximately one atmosphere, is above approximately 0.2.

4. Apparatus according to claim 1, wherein the cavity is filled with gas at a pressure greater than atmospheric pressure.

5. Apparatus according to claim 1, wherein at least one of the substrate and the cap includes a thermal insulating layer about the cavity so as to reduce loss of heat from the cavity.

6. Apparatus according to claim 1, wherein the cap is porous, and wherein the porous cap provides thermal insulation for reducing loss of heat from the cavity.

7. Apparatus according to claim 1, wherein the at least one sensing element comprises:
   at least one heating element; and
   at least one temperature-sensing element.

8. Apparatus comprising:
   a substrate having at least one sensing element; and
   a cap bonded to the substrate over the at least one sensing element by a bonding material, wherein at least one of the cap and the bonding material is porous, and wherein the substrate and the cap form a cavity around the at least one sensing element, and wherein at least one of the substrate and the cap includes a thermal insulating layer about the cavity so as to reduce loss of heat from the cavity, and wherein the capped sensor further comprises a hermetic coating disposed over the cap and the bonding material so as to hermetically seal the cavity.

9. Apparatus according to claim 8, wherein the cap is a hermetic cap, and wherein the hermetic cap is bonded to the substrate using a hermetic bonding material so as to hermetically seal the cavity.

10. Apparatus according to claim 8, wherein the cavity is filled with gas other than air.

11. Apparatus according to claim 10, wherein the ratio of density (in grams per liter) to viscosity (in micropascal-seconds) of the gas at a temperature of approximately 25 degrees Celsius and pressure of approximately one atmosphere, is above approximately 0.2.

12. Apparatus according to claim 8, wherein the cavity is filled with gas at a pressure greater than atmospheric pressure.

13. Apparatus according to claim 8, wherein the at least one sensing element comprises:
   at least one heating element; and
   at least one temperature-sensing element.

* * * * *